United States Patent [19]

Hii et al.

[11] Patent Number: 5,923,599
[45] Date of Patent: Jul. 13, 1999

[54] APPARATUS AND METHOD FOR SUBARRAY TESTING IN DYNAMIC RANDOM ACCESS MEMORIES USING A BUILT-IN-SELF-TEST UNIT

[75] Inventors: Kuong H. Hii, Singapore, China; Danny R. Cline; Theo J. Powell, both of Dallas, Tex.; Wah K. Loh, Richardson, Tex.

[73] Assignee: Texas Instruments Incorporated, Dallas, Tex.

[21] Appl. No.: 08/840,362

[22] Filed: Apr. 29, 1997

Related U.S. Application Data

[60] Provisional application No. 60/016,875, Apr. 29, 1996.

[51] Int. Cl.$^6$ ............................................. G11C 7/00
[52] U.S. Cl. ............... 365/201; 365/230.03; 365/230.06; 365/236
[58] Field of Search ............................. 365/201, 203.03, 365/230.06, 236; 371/21.1, 21.2, 21.3

[56] References Cited

U.S. PATENT DOCUMENTS

| 5,327,363 | 7/1994  | Akiyama ........................... 364/580    |
| 5,548,553 | 8/1996  | Cooper et al. ..................... 365/200    |
| 5,568,437 | 10/1996 | Janal .................................. 365/201 |
| 5,588,006 | 12/1996 | Nozuyama ......................... 371/3       |
| 5,617,531 | 4/1997  | Crouch et al. .................. 395/183.06    |
| 5,640,354 | 6/1997  | Jang et al. ...................... 365/201     |
| 5,640,404 | 6/1997  | Satish ............................... 371/22.3 |
| 5,640,509 | 6/1997  | Balmer et al. ................... 365/201 X    |
| 5,661,729 | 8/1997  | Miyazaki et al. ................ 371/21.2      |
| 5,661,732 | 8/1997  | Lo et al. .......................... 371/21.2  |
| 5,689,466 | 11/1997 | Qureshi ............................ 365/201    |

OTHER PUBLICATIONS

Koike, et al, A BIST Scheme Using Microprogram ROM For Large Capacity Memories, 1990 International Test Conference, Paper 36.1, pp. 815–822.

Koike, et al., BIST Circuit Macro Using Microprogram ROM for LSI Memories, IEICE Trans. Electron. vol. E78–C, No. 7, Tokyo, Japan, pp. 838–844.

Franklin, et al., Built–in Self–Testing of Random–Access Memories, 8153 Computer, Oct. 23, (1990), No. 10, Los Alamitos, CA, pp. 45–56.

Primary Examiner—Huan Hoang
Attorney, Agent, or Firm—Robby T. Holland; Carlton H. Hoel; Richard L. Donaldson

[57] ABSTRACT

In a built-in-self-test (BIST) unit or a memory unit, an address limits unit is provided which, prior to initiation of the test procedures, has start and stop addresses stored therein. Upon the initiation of the test procedures by the BIST unit, the start address of the address limits unit is transferred to the address counters units wherein the start address serves as the initial test address. The stop address is transferred to the address counters unit wherein the stop address will be compared with the current address. When the stop address and the current address match, the test procedure being executed by the BIST unit will be terminated. In this manner, any subarray in the memory unit can be selected for test.

12 Claims, 2 Drawing Sheets

APPARATUS AND METHOD FOR SUBARRAY TESTING IN DYNAMIC RANDOM ACCESS MEMORIES USING A BUILT-IN-SELF-TEST UNIT

This is a Non Provisional application filed under 35 U.S.C. 119(e) and claims priority of prior provisional Ser. No. 60/016,875 of inventor Hii et al. filed Apr. 29, 1996.

This application is related to Ser. No. 08/846,922 of inventor Hii et al. filed on Apr. 30, 1997 which claims priority under 35 USC 119(e) of prior provisional Ser. No. 60/16,516 of inventor Hii et al. filed on Apr. 30, 1996.

BACKGROUND OF THE INVENTION

1. Field of the Invention

This invention relates generally to semiconductor memory units and, more particularly, to semiconductor memory unit in which a built-in-self-test unit has been incorporated.

2. Description of the Related Art

As the number of storage cells and the complexity of semiconductor memories have increased, the length of time required to test the memories, not-with-standing decreasing clock cycle time, has continually increased. Originally, the semiconductor memory devices could be tested by coupling the devices to a testing unit. However, as the length of time has required to test each devices has increased, the use of testing units has become impractical and indeed provides a potential bottleneck the delivery of the devices to the marketplace.

The potential testing bottleneck has been resolved by providing incorporating apparatus internal to the device which can test the device with little external assistance. One implementation of self-testing apparatus is referred to as a built-in-self-test (BIST) unit. The BIST unit can test the storage cell array and associated equipment while coupled to a relatively simple test board. Using the BIST apparatus, one test board can control the testing procedures of a multiplicity of memory units. Typically, the result of the memory unit test by the BIST unit is communicated through a single memory unit terminal.

The BIST unit, in response to commands from the associated test board, typically tests the entire storage cell and provides an indicia of the results of the test procedure. In many situations, limiting the test procedures to those involving the entire memory unit can result in an unsatisfactory test procedure. For example, in testing a prototype memory unit, the failure of the prototype memory unit may be the result of either a failure of the BIST unit or a design flaw in a portion of the memory unit. In either situation, the mere failure of the test procedure does not provide enough information to localize problem with sufficient accuracy to know how to eliminate the problem.

One approach to the problem of limiting the portion of the memory unit being tested by the BIST unit is control the upper limit of the storage cell array addresses being tested. In this approach, by varying the address upper limit, the testing of the storage cell array can be systematically expanded to include the entire storage cell array. However, this test procedure is not useful for any address above that address including the first-identified defect. And this approach is particularly unsatisfactory when the identified defect occurs at a relatively low address.

A need has therefore been felt for a built-in-test-unit (BIST) unit and associated procedures which would permit the testing of a selected portion of the memory unit and the communication of the results of this partial memory unit test. In addition, it is desirable that this increased functionality of the BIST unit be accomplished without the requiring additional terminals for the memory unit.

SUMMARY OF THE INVENTION

The aforementioned and other features are accomplished, according to the present invention, by incorporating in the BIST unit of the memory unit an address limits unit. The address limits register includes upper and lower row address registers and upper and lower column address registers. These four registers are loaded through existing terminals of the memory unit and define upper and lower address for the memory unit. During operation of the BIST unit, these registers determine the address at which the testing procedure begins and the address at which the testing procedure is terminated. In this manner, an arbitrary subarray of the memory unit can be tested.

These and other features of the present invention will be understood upon the reading of the following description in conjunction with the Figures.

DESCRIPTION OF THE PREFERRED EMBODIMENT(S)

1. Detailed Description of the Drawings

Figure 1:
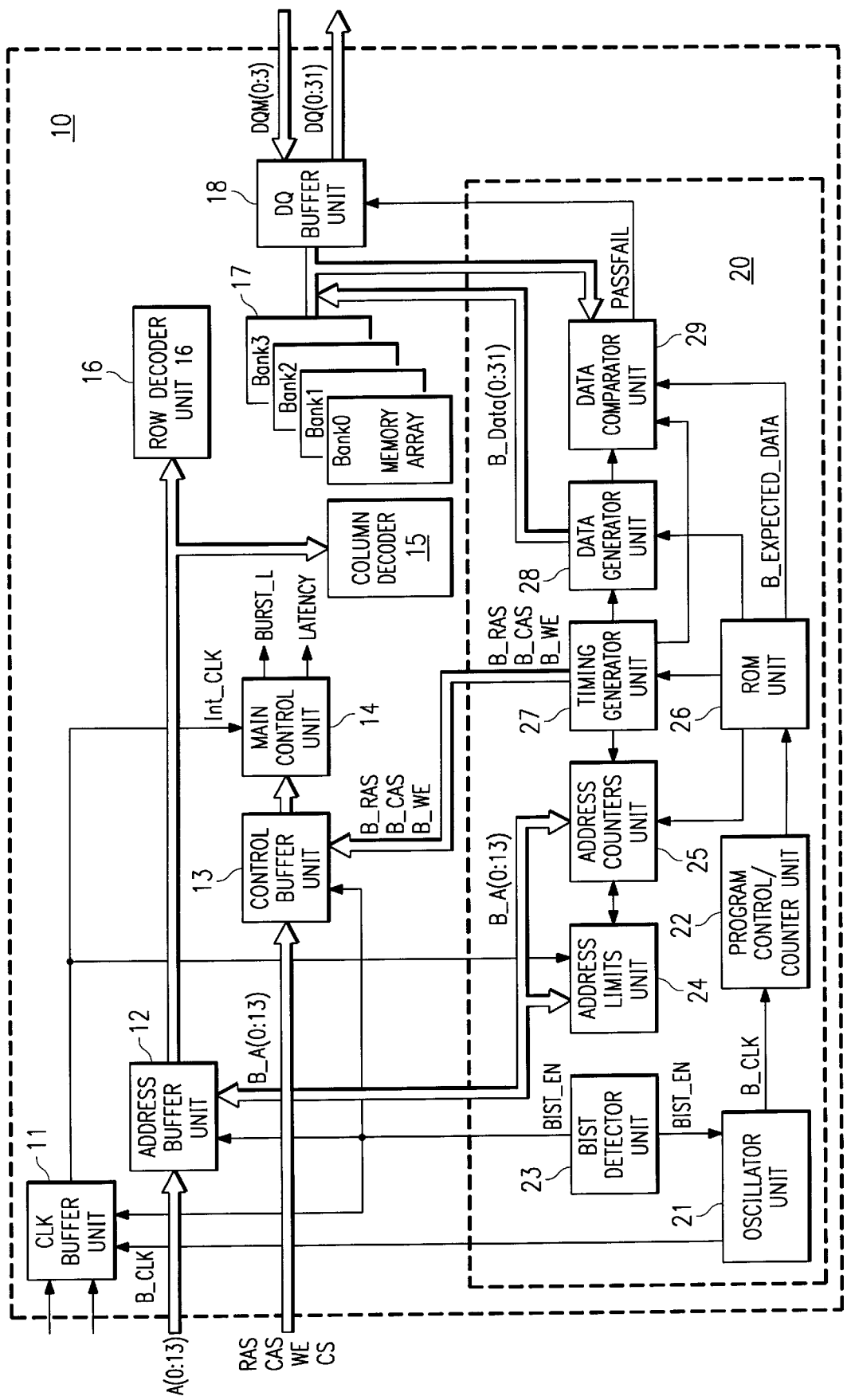
FIG. 1 is a schematic block diagram of a memory unit including a built-in-self-test unit according to the present invention.

Referring to FIG. 1, a schematic block diagram of the memory unit with a built-in-self-test unit according to the present invention is shown. The memory portion of the memory unit 20 includes a clock buffer unit 11 which receives clock signals from external processing apparatus, a address buffer unit 12 which receives address signals from external processing apparatus, a control buffer unit 13 which receives control signals (such as the RAS, CAS, WE and CS signals) from external processing apparatus, and a data (DQ) buffer unit 18 which exchanges data signals with external processing apparatus. Control signals from the control buffer unit 12 and clock signals from the clock buffer unit 11 are applied to the main control unit 14. The main control unit 14 applies control signals to memory array 17 which determine the operation performed by the main control unit 14. Address signals from the address buffer unit 12 are applied to the column decoder unit 15 and to the row decoder unit 16. The row decoder unit 16 and the column decoder unit 15 determine upon which storage cells in the memory array 17 the operation is performed. The data buffer 18 exchanges data signal with the memory array 17, the data signals being either stored into or retrieved from addressed storage cells in the memory array 17. To the typical elements of the memory unit 10 has been added a built-in-self-test (BIST) unit 20. The BIST unit 20 includes a BIST detector unit 23 which, in response to predetermined memory unit 10 conditions and signals, places the memory unit in a self-test standby mode by generating a BIST_EN signal. The BIST_EN signal is applied to the address buffer unit 12, the control buffer unit 13, the clock buffer unit 11, and to oscillator unit 21. The oscillator unit 21 applies a B_CLK signal to a clock buffer unit 11 and to program control/counter unit 22 when the CS_ signal makes a low-to-high transition. Address buffer unit 12 exchanges signals with the address limits unit 24 and with the address counters unit 25. The address counters unit 25 exchanges signals with the address limits unit 24 and applies signals to the address buffer unit 12. The program control/counter unit 22 applies signals to the ROM (read only memory) unit 26. The ROM unit 26 applies a signal to the address counter unit 25, to the timing generator unit 27, to the data generator unit 28, and applies the B_EXPECTED_DATA signal to the data comparator 29. The timing generator unit 27 applies signals to the address counters unit 25, applies control signals (e.g., B_CAS, B_RAS, and B_WE) to the control buffer unit 13, applies signals to the data generator 28, and applies signals to the data comparator 29. The data generator unit 28 applies signals to the memory array 17 and applies signals to the data comparator 29. The data comparator unit 29 receives signals from the memory array 17 and applies a PASSFAIL signal to the data buffer unit 18.

Figure 2:
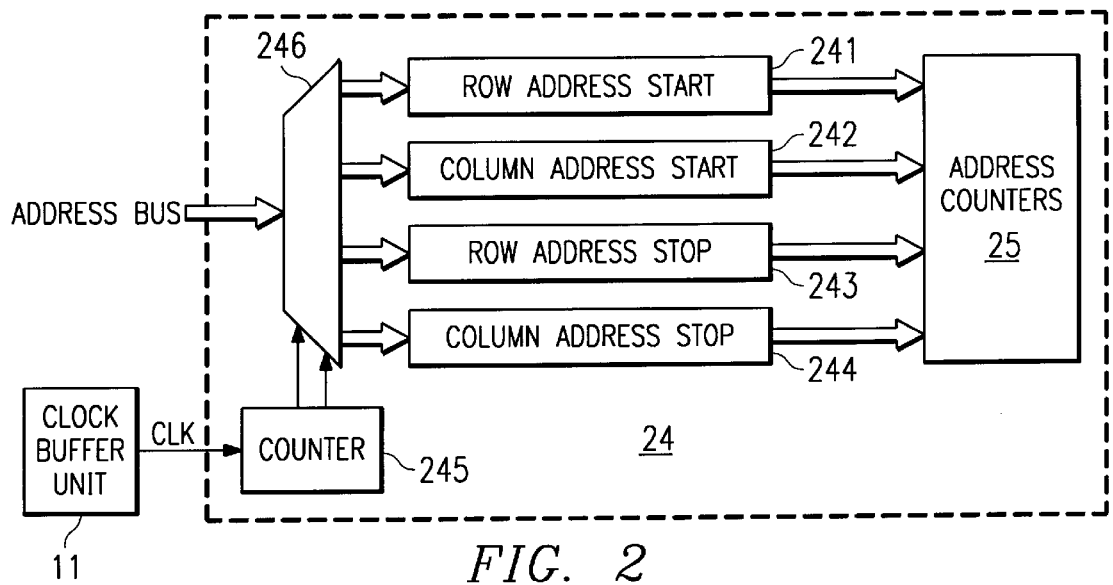
FIG. 2 is block diagram of the address limits register unit in the BIST unit of a memory unit according to the present invention.

Referring to FIG. 2, the components of the address limits unit 24 is shown. The counter 245 receives clock signals from clock buffer unit 11 and applies signals to multiplexer 246. The address bus provides input signals to multiplexer 246 while the output signals from multiplexer 246 are applied to the ROW ADDRESS START register 241, to the COLUMN ADDRESS START register 242, to the ROW ADDRESS STOP register 243, and to the COLUMN ADDRESS STOP register 244. The signals from registers 241–244 are applied to the address counter unit 25.

Figure 3:
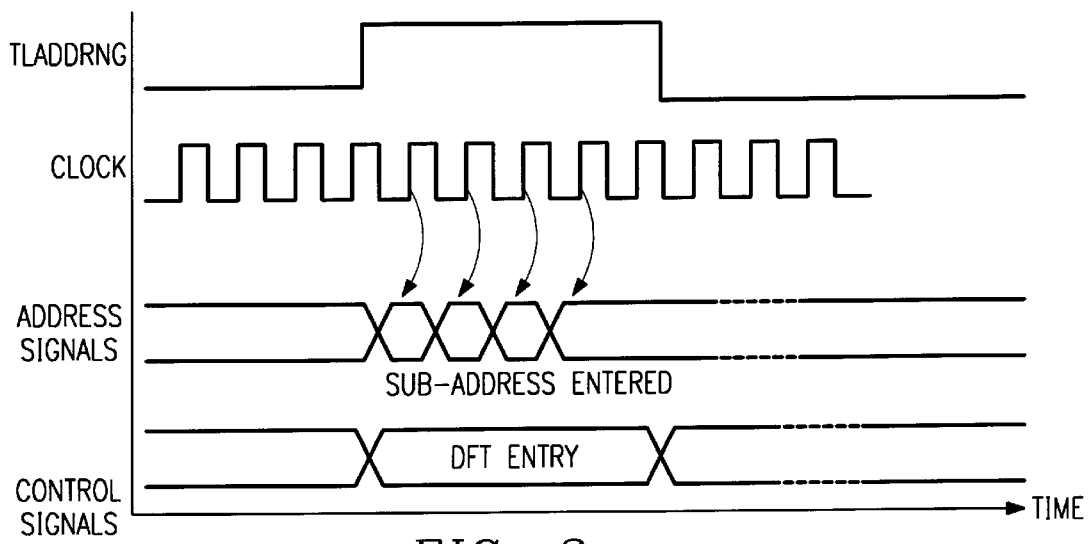
FIG. 3 is a timing diagram showing the relationship of selected signals during the loading of the address limits unit.

Referring to FIG. 3, the relationship of selected signals for the loading of the start and stop addresses in the address limits unit is shown. A combination of control signals enables the design-for-test functionality. The TLADDRNG command is then applied to the memory unit. In response to the TLADDRNG command, address line signals are entered into the registers in synchronism with the system clock.

2. Operation of the Preferred Embodiment(s)

The operation of the present invention can be understood in the following manner. After power-up of the memory unit, but before the activation of the BIST apparatus. A design-for-test command is identified by the appropriate application of control signals to the memory unit. The TLADDRNG command is applied to the memory unit via the address lines. While the TLADDRNG command is active, the signals from the clock buffer unit 11 are applied to the counter 245. The signals from the counter unit 245 permit multiplexer 246 to load address signals, applied to the multiplexer unit 246 from the address bus, into the limit registers 241–244. After the enabling control signals and the TLADDRNG command are removed, the BIST unit 20 is activated and the test procedures initiated. As part of the initiation process and during the register reset of the address counters, the start row and column addresses are transferred to the address counters and, together, provide the starting address for the testing of the memory unit. The stop address is transferred to the address counters unit 25. As the counters in the address counters unit 25 are incremented, the current address is compared with the stop address. When the stop address and the current address are equal, the test procedure for a ROM word instruction is terminated, the program counter is incremented and the execution of the next ROM instruction is initiated. By controlling the start address and the stop address, any subset or subarray can be selected for testing.

The invention has been described with particular reference to the preferred embodiment, it will be under stood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A memory unit, comprising a semiconductor memory array and related components;

a built-in-self test unit for testing said memory array and related components, said built-in-self-test unit including;

an address limits unit, said address limits unit having registers for storing a start address signal and a stop address signal, said start address signal and said stop address signal defining a selected subarray; and wherein said registers store externally-generated signals.

2. The memory unit of claim 1 wherein said externally-generated signals are stored in said registers as a result of a design-for-test procedure.

3. The memory unit of claim 1 wherein said BIST unit includes an address counter unit, said address counter unit generating test address signals for semiconductor array locations to be tested.

4. The memory unit of claim 3 wherein said start address signals and said stop address signals are transferred to said address counter unit and define a range of locations in said semiconductor memory to be tested.

5. The method of testing a selected subarray of a semiconductor memory array in a memory unit having a built-in-self-test (BIST) unit, said method comprising the steps of;

storing externally-generated start address signals and stop address signals in a storage unit when said BIST unit is in a non-test mode, said start address signals and said stop address signals defining said selected subarray; and transferring said start address signals and said stop address signals to an address generating unit of said BIST unit, said start address signals and said stop address signals resulting in a testing of said selected subarray.

6. The method of claim 5 wherein said storing step include the step of storing said externally-generated start address signals and stop address signals as a result of a design-for-test procedure in said memory unit.

7. The method of claim 6 wherein in said storing step includes the step of storing said externally-generated start address signals and stop address signals into registers in said BIST unit.

8. In a semiconductor memory unit having a memory array and associated addressing and control apparatus, a built-in-self-test (BIST) unit for testing said memory array and said associated addressing and control apparatus, said BIST unit comprising:

timing signal apparatus for generating timing signals and preselected sequence of control signals;

data signal generating apparatus responsive to timing signals for generating preselected sequence of data signals;

address signals generating apparatus responsive to timing signals for generating a preselected sequence of address signals; and address limits apparatus coupled to said address signal apparatus for determining a starting address and a stopping address for said address signal generating apparatus, said address limits apparatus storing externally-generated start address signals and stop address signals.

9. The BIST unit of claim 8 wherein said externally-generated start address signals and stop address signals are transferred to said address limits apparatus through terminals of said memory array and associated addressing and control apparatus.

10. The BIST unit of claim 8 wherein said start address signals and said stop address signals limit testing by said BIST unit to the subarray and associated addressing and control apparatus.

11. The BIST unit of claim 8 wherein said BIST unit includes a standby, said memory array capable of being accessed during said standby mode.

12. The BIST unit of claim 11 wherein said start and stop address signals are stored in said BIST unit during said standby mode.

* * * * *